(12) United States Patent
Huang et al.

(10) Patent No.: US 9,584,143 B2
(45) Date of Patent: Feb. 28, 2017

(54) MODULATOR, PHASE LOCKED LOOP USING THE SAME, AND METHOD APPLIED THERETO

(71) Applicant: MEDIATEK Inc., Hsin-Chu (TW)

(72) Inventors: Yi-Chieh Huang, Taichung (TW); Ping-Ying Wang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/943,129

(22) Filed: Nov. 17, 2015

(65) Prior Publication Data

US 2016/0211967 A1 Jul. 21, 2016

Related U.S. Application Data

(60) Provisional application No. 62/103,735, filed on Jan. 15, 2015.

(51) Int. Cl.
  *H04L 7/033* (2006.01)
  *H03L 7/197* (2006.01)
  *H03C 3/00* (2006.01)

(52) U.S. Cl.
  CPC ............ *H03L 7/1976* (2013.01); *H03C 3/00* (2013.01)

(58) Field of Classification Search
  USPC ..................................... 375/376; 331/16, 18
  See application file for complete search history.

(56) References Cited

U.S. PATENT DOCUMENTS

| 5,999,060 A * | 12/1999 | Zuta ........................ H03L 7/085 331/1 A |
| 2001/0033200 A1* | 10/2001 | Staszewski ............... H03L 7/18 331/18 |
| 2007/0159263 A1* | 7/2007 | Chou .................... H03L 7/0814 331/16 |
| 2009/0243735 A1* | 10/2009 | Luiz ........................ H03L 7/093 331/1 A |

OTHER PUBLICATIONS

Wang, et al.: "Spurious Tone Suppression Techniques Applied to a Wide-Bandwidth 2.4 GHz Fractional-N PLL"; IEEE Journal of Solid-State Circuits, vol. 43, No. 12, Dec. 2008; pp. 2787-2797.

* cited by examiner

*Primary Examiner* — Eva Puente
(74) *Attorney, Agent, or Firm* — McClure, Qualey & Rodack, LLP (57) ABSTRACT

A modulator for generating a control code in response to a frequency control word is provided. The modulator includes an adder, an accumulator, a next state generation unit, and a code generation unit. The adder generates a frequency error signal by calculating a difference between the frequency control word and the control code. The accumulator generates a phase error signal by accumulating the frequency error signal. The phase error signal includes an integer part and a fractional part. The integer part of the phase error signal is a current state signal. The next state generation unit generates a next state signal according to a characteristic probability distribution determined by the fractional part of the phase error signal. The code generation unit generates the control code in response to the current state signal and the next state signal.

25 Claims, 5 Drawing Sheets

MODULATOR, PHASE LOCKED LOOP USING THE SAME, AND METHOD APPLIED THERETO

This application claims the benefit of U.S. provisional application Ser. No. 62/103,735, filed Jan. 15, 2015, the subject matter of which is incorporated herein by reference.

FIELD OF THE INVENTION

The present invention relates to a modulator, and more particularly, to a modulator for controlling a frequency divider in a fractional phase locked loop.

BACKGROUND OF THE INVENTION

Phase locked loops (PLL) are widely used in various applications such as wireless communication system and wireline communication system. The PLL is a closed-loop feedback control system that generates a signal in relation to the frequency and phase of a reference signal. PLL may be implemented as either analog or digital circuits including a phase detector (PD), a loop filter (LF), a voltage controlled oscillator (VCO), and a feedback path. The PLL may also include a frequency divider in a feedback configuration between the VCO and the PD. In some applications it may be desirable to output a frequency that is a fractional multiple of the reference signal. In this situation, a fractional PLL is necessary to divide the output frequency of the VCO by a fractional number.

Various techniques are used to implement a fractional PLL frequency divider. One such technique is adopting a multi modulus divider. A modulator may be used to drive the multi modulus divider with different integer division factors in order to obtain a fractional average division factor. However, fractional spurs may be generated in a fractional PLL. The modulator used to control the frequency divider may introduce noise into PLL. Nonlinearity of several blocks in PLL, such as integer frequency divider, phase detector, charge pump and loop filter may cause fractional spurs. Thus there is a need for a PLL having a fractional frequency divider insensitive to nonlinearity effect.

SUMMARY OF THE INVENTION

The disclosure is directed to a modulator. The modulator generates a control code in response to a frequency control word. The control code controls a multi modulus divider in a fractional phase locked loop. One of the advantages of the modulator is being insensitive to nonlinearity.

In an embodiment, a modulator for generating a control code in response to a frequency control word is provided. The modulator includes an adder, an accumulator, a next state generation unit, and a code generation unit. The adder generates a frequency error signal by calculating a difference between the frequency control word and the control code. The accumulator generates a phase error signal by accumulating the frequency error signal. The phase error signal includes an integer part and a fractional part. The integer part of the phase error signal is a current state signal. The next state generation unit generates a next state signal in response to a characteristic probability distribution determined by the fractional part of the phase error signal. The code generation unit generates the control code in response to the current state signal and the next state signal.

In an embodiment, a phase locked loop for generating an output signal in response to a reference signal and a frequency control word is provided. The phase locked loop includes a phase detector, a loop filter, a voltage controlled oscillator, a multi modulus divider, and a modulator. The phase detector generates a phase difference between the reference signal and a feedback signal. The loop filter generates a control voltage by removing a high frequency component of the phase difference. The voltage controlled oscillator generates the output signal oscillating at a frequency in response to the control voltage. The multi modulus divider generates the feedback signal by dividing the frequency of the output signal by a divisor controlled by a control code. The modulator generates the control code in response to the frequency control word. The modulator includes an adder, an accumulator, a next state generation unit, and a code generation unit. The adder generates a frequency error signal by calculating a difference between the frequency control word and the control code. The accumulator generates a phase error signal by accumulating the frequency error signal. The phase error signal includes an integer part and a fractional part. The integer part of the phase error signal is a current state signal. The state generation unit generates a next state signal in response to a characteristic probability distribution determined by the fractional part of the phase error signal. The code generation unit generates the control code in response to the current state signal and the next state signal.

In an embodiment, a method for generating a control code in response to a frequency control word is provided. The control code controls a multi modulus divider in a fractional phase locked loop. The method includes the following steps: generating a frequency error signal by calculating a difference between the frequency control word and the control code; generating a phase error signal by accumulating the frequency error signal, wherein the phase error signal includes an integer part and a fractional part, and the integer part of the phase error signal is a current state signal; generating a next state signal according to a characteristic probability distribution determined by the fractional part of the phase error signal; and generating the control code in response to the current state signal and the next state signal.

In an embodiment, a computer-implemented method for generating a probability mass function for a discrete random variable is provided. The discrete random variable is an integer part of a phase error signal. The method includes the following step: determining, by a processor, the probability mass function as a function of a fractional part of the phase error signal, wherein a first expected value of the phase error signal according to the probability mass function is a first constant value regardless of the fractional part of the phase error signal.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF PREFERRED EMBODIMENTS

Figure 1:
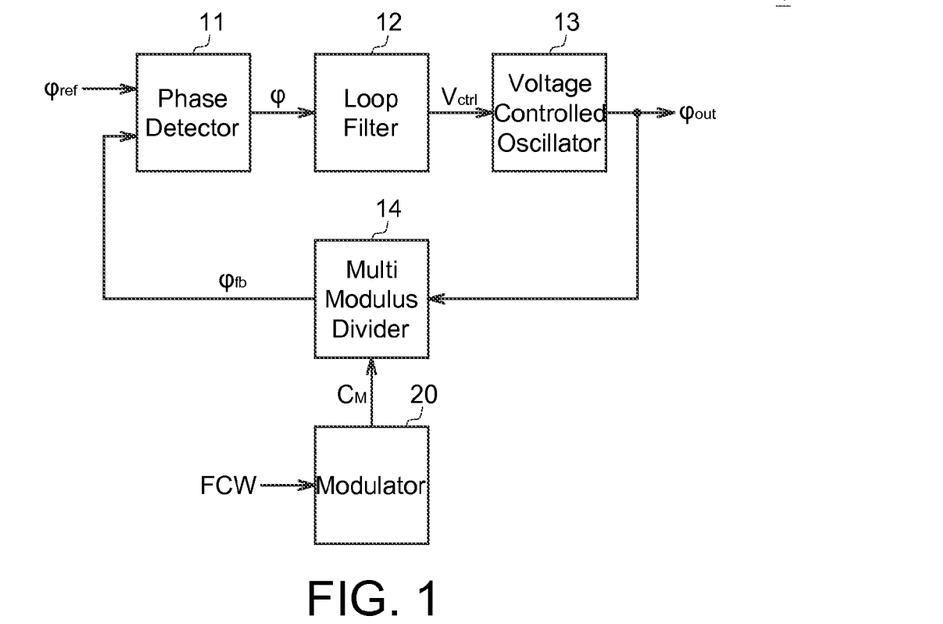
FIG. 1 shows a fractional phase locked loop according to an embodiment of this disclosure.

FIG. 1 shows a fractional phase locked loop 1 according to an embodiment of this disclosure. The phase locked loop 1 generates an output signal $\phi_{out}$ in response to a reference signal $\phi_{ref}$ and a frequency control word FCW. The phase locked loop 1 includes a phase detector 11, a loop filter 12, a voltage controlled oscillator 13, a multi modulus divider 14, and a modulator 20. The phase detector 11 generates a phase difference $\phi$ between the reference signal $\phi_{ref}$ and a feedback signal $\phi_{fb}$. The loop filter 12 generates a control voltage $V_{ctrl}$ by removing a high frequency component of the phase difference $\phi$. The voltage controlled oscillator 13 generates the output signal $\phi_{out}$ oscillating at a frequency in response to the control voltage $V_{ctrl}$. The multi modulus divider 14 generates the feedback signal $\phi_{fb}$ by dividing the frequency of the output signal $\phi_{out}$ by a divisor controlled by a control code $C_M$. The modulator 20 generates the control code $C_M$ in response to the frequency control word FCW.

The phase locked loop 1 automatically raises or lowers the frequency of the output signal $\phi_{out}$ until the phase of the output signal $\phi_{out}$ matches the phase of the reference signal $\phi_{ref}$. The frequency control word FCW may be a fractional number represented as (N.f), such as 10.2. N is the integer part and (.f) is the fractional part of the frequency control word FCW. The frequency of the output signal $\phi_{out}$ is (N.f) times to the frequency of the reference signal $\phi_{ref}$. The multi modulus divider 14 may be an integer divider with various integer divisors controlled by the control code $C_M$. For example, if (N.f) is equal to 10.2, the integer divisors within the multi modulus divider 14 may include 10 and 11 to generate an effective average divisor equal to 10.2. The integer divisor is controlled by the control code $C_M$ generated by the modulator 20.

Figure 2:
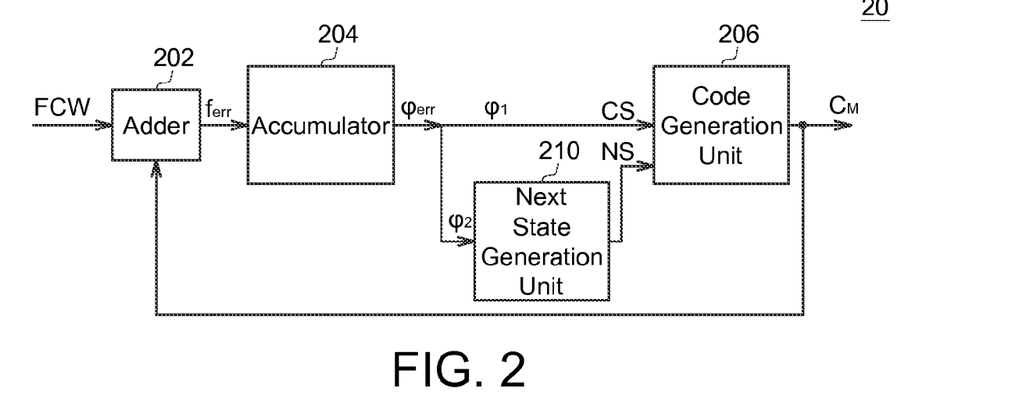
FIG. 2 shows a modulator according to an embodiment of this disclosure.

FIG. 2 shows a modulator 20 according to an embodiment of this disclosure. The modulator 20 generates the control code $C_M$ in response to the frequency control word FCW. The modulator 20 includes an adder 202, an accumulator 204, a next state generation unit 210, and a code generation unit 206. The adder 202 generates a frequency error signal $f_{err}$ by calculating a difference between the frequency control word FCW and the control code $C_M$. The accumulator 204 generates a phase error signal $\phi_{err}$ by accumulating the frequency error signal $f_{err}$. The phase error signal $\phi_{err}$ includes an integer part $\phi_1$ and a fractional part $\phi_2$. The integer part $\phi_1$ of the phase error signal $\phi_{err}$ is a current state signal CS. The next state generation unit 210 generates a next state signal NS in response to a characteristic probability distribution $f_c(S, \alpha)$ determined by the fractional part $\phi_2$ of the phase error signal $\phi_{err}$. The code generation unit 206 generates the control code $C_M$ in response to the current state signal CS and the next state signal NS. The detailed description of modulator 20 is given below.

The adder 202 generates a frequency error signal $f_{err}$ by calculating a difference between the frequency control word FCW and the control code $C_M$. In one embodiment, the frequency error signal $f_{err}$ is equal to the frequency control word FCW subtracted from the control code $C_M$. For example, if frequency control word FCW (=N.f) is 10.2 and the control code $C_M$ is 11, the frequency error signal $f_{err}$ is equal to 11−10.2=0.8. In another embodiment, the control code $C_M$ for a divisor value 11 may be +1 (as compared to the nominal divisor value 10). The frequency error signal $f_{err}$ f may be equal to the fractional part of the frequency control word FCW (0.2) subtracted from the control code $C_M$ ($f_{err}$=1−0.2=0.8). In still another embodiment, the frequency error signal $f_{err}$ may be obtained by subtracting the control code $C_M$ from frequency control word FCW ($f_{err}$=10.2−11=−0.8). The adder 202 may operate on binary numbers represented in two's complement form to support subtraction operation. A negative feedback path is formed within the modulator 20 by calculating the difference between the output control code $C_M$ and the input frequency control word FCW. The frequency error signal $f_{err}$ is the difference between the currently generated control code $C_M$ and the frequency control word FCW representing a target divisor value N.f. Thus the frequency error signal $f_{err}$ represents a quantization noise generated during a quantization process of generating an integer control code $C_M$.

Since the phase error may be obtained by integrating frequency error over time, the accumulator 204 generates a phase error signal $\phi_{err}$ by accumulating the frequency error signal $f_{err}$. In other words, the frequency error signal $f_{err}$ of each sample is accumulated to obtain the phase error signal $\phi_{err}$. Because the frequency error signal $f_{err}$ is related to the control code $C_M$, the phase error signal $\phi_{err}$ may be controlled within a range by appropriately designed control code $C_M$.

In one embodiment, the phase error signal $\phi_{err}$ in the modulator 20 is controlled within the range of [−2$T_{vco}$, 2$T_{vco}$], where $T_{vco}$ is the desired signal period at output terminal of the VCO 13 indicated by the frequency control word FCW.

Figure 3:
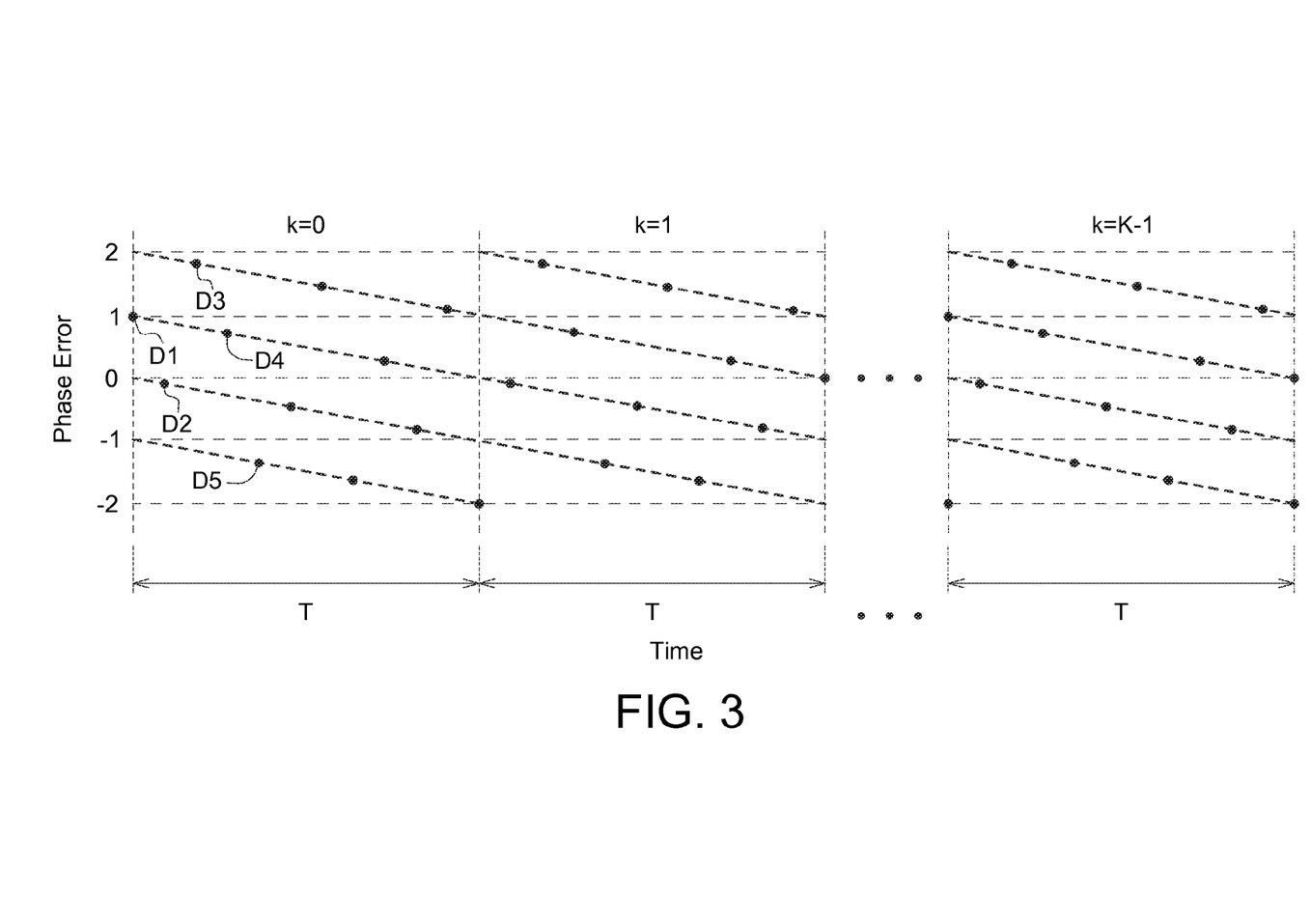
FIG. 3 shows an example of a phase error signal measured in the modulator according to an embodiment of this disclosure.

FIG. 3 shows an example of a phase error signal $\phi_{err}$ measured in the modulator 20 according to an embodiment of this disclosure. Each dot represents the phase error signal $\phi_{err}$ at that time instant. Note that the phase error signal $\phi_{err}$ an accumulation result of the frequency error signal $f_{err}$. In this embodiment, the frequency error signal $f_{err}$ is equal to the control code $C_M$ minus the frequency control word FCW ($f_{err}$=$C_M$−FCW). The frequency control word FCW is equal to N.f, and the control code $C_M$ is one of {N+4, N+3, N+2, N+1, N, N−1, N−2, N−3}. The average value of the control code $C_M$ generated by the modulator 20 is equal to N.f. If the fractional part of the frequency control word FCW is represented as β(β=0.f), the frequency error signal $f_{err}$ is equal to {4−β, 3−β, 2−β, 1−β, 0−β, −1−β, −2−β, −3−β}.

The phase error signal $\phi_{err}$ thus accumulated includes the integer part $\phi_1$ and the fractional part $\phi_2$. As shown in FIG. 3, because the fractional part $\phi_2$ results from accumulation of (−β), the line representing the phase error signal $\phi_{err}$ versus time has a slope of (−β). On the other hand, the integer part $\phi_1$ is an accumulation result of the integer part of the frequency error signal $f_{err}$. By carefully designing the order of control code $C_M$ (which will be described later), the phase error signal $\phi_{err}$ can be controlled within the range of [−2, 2]. The integer part $\phi_1$ changes between four different states. In other words, the phase error signal $\phi_{err}$ may be represented as (A−α), where A is one of four possible values {2, 1, 0, −1} and (−α) is the fractional part of accumulating (−β). The period T of one sub-frame may be defined as the time needed to accumulate (−β) to −1, and thus the period T=(1/β). For the example shown in FIG. 3, the phase error signal $\phi_{err}$ at time {D1, D2, D3, D4, D5} is {1−α1, 0−α2, 2−α3, 1−α4, −1−α5}, where each α value represents the accumulation of β so far. The frequency error signal $f_{err}$ at time {D2, D3, D4, D5} is {−1−β, +2−β, −1−β, −2−β}. For instance, the phase error at time D1 (1−α1)+the frequency error at time D2 (−1−β)=the phase error at time D2 (0−α2). The phase error at time D2 (0−α2)+the frequency error at time D3 (+2−β)= the phase error at time D3 (2−α3).

Figure 4:
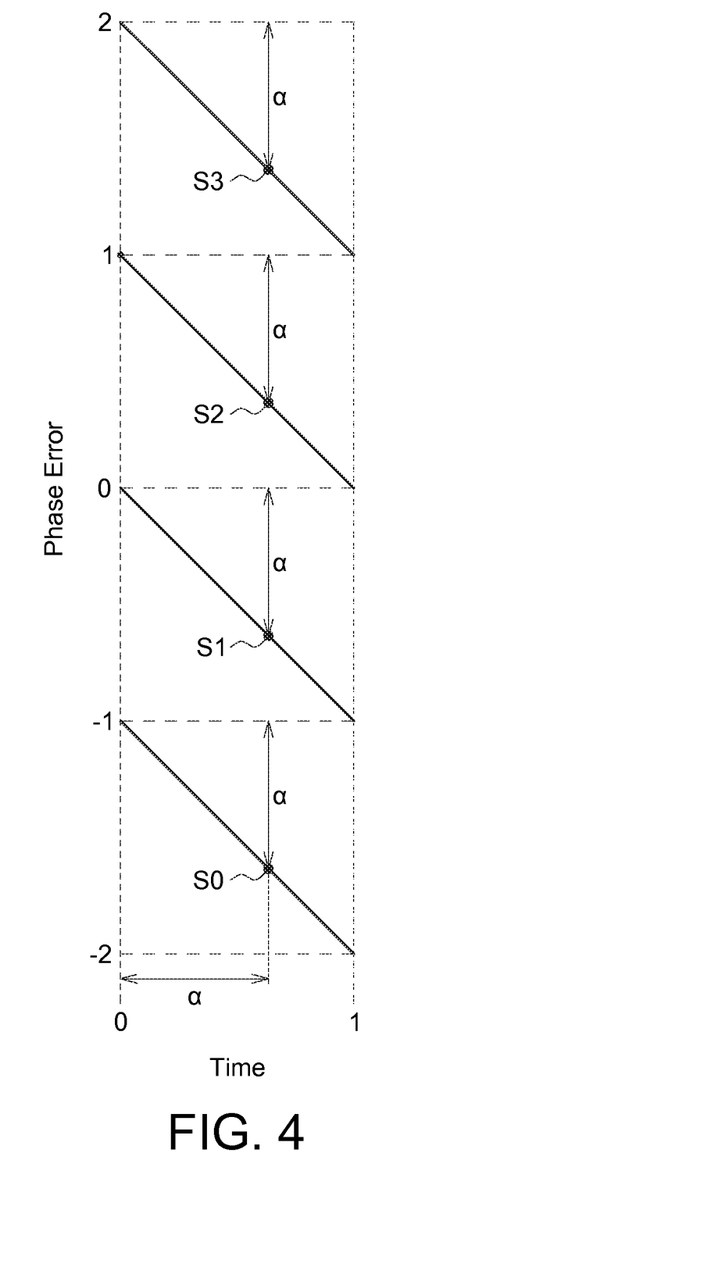
FIG. 4 shows an eye diagram of the phase error signal according to an embodiment of this disclosure.

FIG. 4 shows an eye diagram of the phase error signal $\phi_{err}$ according to an embodiment of this disclosure. FIG. 4 is obtained by overlapping each sub-frame k shown in FIG. 3. The period T as well as the phase error signal $\phi_{err}$ normalized to 1 for better understanding. As shown in FIG. 4, the phase error signal $\phi_{err}$ lies in one of four lines with slope=−1 (normalized as compared to FIG. 3). At a specific time instant α(0≤α≤1), the phase error signal $\phi_{err}$ is equal to one of four possible values {2−α, 1−α, 0−α, −1−α}, represented as four different states {S3, S2, S1, S0}. In an embodiment, the modulator 20 determines which next state will be according to the α value. Specifically, the next state is determined according to a characteristic probability distribution.

As mentioned above, α represents the fractional part of the phase error signal $\phi_{err}$. Refer to FIG. 2, the next state generation unit 210 generates a next state signal NS according to a characteristic probability distribution $f_c(S, α)$ determined by the fractional part $\phi_2$ of the phase error signal $\phi_{err}$, which is equal to α shown in FIG. 4. The symbols $\phi_2$ and α will be used interchangeably for representing the fractional part of the phase error signal $\phi_{err}$ in this disclosure.

In one embodiment, the next state signal NS is a discrete random variable with multiple probability mass functions $f_i(S, α)$ corresponding to different values of the fractional part α of the phase error signal $\phi_{err}$, where the state S may be {S0, S1, S2, S3}. The next state generation unit 210 selects one of the probability mass functions $f_i(S, α)$ as the characteristic probability distribution $f_c(S, α)$ in response to the fractional part α of the phase error signal $\phi_{err}$.

Because of the nonlinearity caused by several blocks in the PLL 1, the objective of the modulator 20 is to provide the control code $C_M$ insensitive to nonlinearity. Specifically, the modulator 20 generates the control code $C_M$ such that the fractional spurs on the spectrum are eliminated whatever nonlinear functions are in the PLL 1. Therefore the multiple probability mass functions $f_i(S, α)$ are designed such that the phase error signal $\phi_{err}$ after nonlinear transformation produces substantially no fractional spurs.

Assume x[n] is a discrete-time sequence representing the sequence after linear or nonlinear transformation of the phase error signal $\phi_{err}$. The objective is to make the fractional spur component X[1] equal to 0, wherein X[i] is the coefficient of the $i^{th}$ term of the Fourier series representation of the sequence x[n]. X[1] corresponds to the frequency component of the fraction spur, as the normalization of time period (1/β) to 1 shown in FIG. 4.

Please refer to FIG. 3 and FIG. 4, Fourier transform is performed on K sub-frames shown in FIG. 3. The Fourier series coefficient of the discrete-time sequence x[n] can be calculated as follows, where n is a fractional number that can be represented as (k+α), where k and α are the integer part and the fractional part, representing the $k^{th}$ sub-frame at α location.

$$X(1) = \sum_{n=0}^{N} x[n] \cdot e^{-j2\pi \cdot n} =$$

$$\sum_{k=0}^{K-1} \sum_{a=0}^{1} x[k+\alpha] \cdot e^{-j2\pi \cdot (k+\alpha)} = K \sum_{a=0}^{1} \left( \frac{1}{K} \sum_{k=0}^{K-1} x[k+\alpha] \right) \cdot e^{-j2\pi \cdot (k+\alpha)}$$

If the term $$\left( \frac{1}{K} \sum_{k=0}^{K-1} x[k+\alpha] \right)$$

is a constant value C regardless of the α value, the above equation can be rewritten as:

$$X(1) = K \sum_{a=0}^{1} C \cdot e^{-j2\pi \cdot \alpha} = K \cdot C \left( \sum_{a=0}^{1} e^{-j2\pi \cdot \alpha} \right) = 0.$$

The fractional spur component is thus eliminated. Note that the term $$\left( \frac{1}{K} \sum_{k=0}^{K-1} x[k+\alpha] \right)$$

represents the average value of x[n] over K sub-frames at a particular α value (at a particular time instant α at each sub-frame). Thus the objective is to make the expected value of x[n] a constant value C for every possible α value by designing the probability mass functions.

As shown in FIG. 4, the next state signal NS is a random variable with four possible states {S3, S2, S1, S0}. The phase error signal $\phi_{err}$ is equal to {2−α, 1−α, 0−α, −1−α} in these four states respectively. The corresponding probability mass function is {P3, P2, P1, P0}, where P3=f(S3, α), P2=f(S2, α), P2=f(S2, α), and P1=f(S1, α). Each of P3, P2, P1, P0 is a function of α. Therefore when α changes, the probability mass function {P3, P2, P1, P0} changes accordingly. The basic principle of a probability mass function P3+P2+P1+P0=1 always holds.

In one embodiment, in order to make the modulator 20 insensitive to $2^{nd}$ order nonlinearity and $3^{rd}$ order nonlinearity, the sequence x[n] may be the phase error signal $\phi_{err}$, or the phase error signal $\phi_{err}$ to the $2^{nd}$ power, or the phase error signal $\phi_{err}$ to the $3^{rd}$ power. The expected value of x[n] has to be a constant value C independent of the α value. In other words, multiple first expected values of the phase error signal $\phi_{err}$ $E[\phi_{err}]$ corresponding to multiple probability mass functions $f_i(S, \alpha)$ are the same, which is set to a constant value C1. Multiple second expected values of the phase error signal $\phi_{err}$ the second power $E[\phi_{err}^2]$ corresponding to multiple probability mass functions $f_i(S, \alpha)$ are the same, which is set to a constant value C2. Multiple third expected values of the phase error signal $\phi_{err}$ to the third power $E[\phi_{err}^3]$ corresponding to multiple probability mass functions $f_i(S, \alpha)$ are the same, which is set to a constant value C3. The expected values can be calculated as follows:

$$E[\varphi_{err}] = [P0(-1-\alpha) + P1(-\alpha) + P2(1-\alpha) + P3(2-\alpha)]$$
$$= [(-P0 + P2 + 2P3) - \alpha(P0 + P1 + P2 + P3)]$$
$$= C1$$

$$E[\varphi_{err}^2] = [P0(-1-\alpha)^2 + P1(-\alpha)^2 + P2(1-\alpha)^2 + P3(2-\alpha)^2]$$
$$= [(P0 + P2 + 4P3) + \alpha(2P0 - 2P2 - 4P3) + \alpha^2]$$
$$= C2$$

$$E[\varphi_{err}^3] = [P0(-1-\alpha)^3 + P1(-\alpha)^3 + P2(1-\alpha)^3 + P3(2-\alpha)^3]$$
$$= [(-P0 + P2 + 8P3) + \alpha(-3P0 - 3P2 - 12P3) +$$
$$\alpha^2(-3P0 + 3P2 + 6P3) - \alpha^3]$$
$$= C3$$

The probability mass function {P3, P2, P1, P0} makes each of three expected values listed above a constant value. The above three equations along with the fourth equation is P3+P2+P1+P0=1 form a set of equations. There is also a boundary condition $0 \leq Pi \leq 1$, $0 \leq i \leq 3$ to be satisfied. For different constant values {C1, C2, C3}, different solutions of {P3, P2, P1, P0} may be obtained.

In one embodiment, C1 is set to 0, and C3 is also set to 0. The probability mass function thus solved can be expressed as follows:

$$P3 = 0 + \frac{(3C2-1)}{6}\alpha + 0\alpha^2 + \frac{1}{6}\alpha^3$$
$$P2 = \frac{C2}{2} + \frac{(2-3C2)}{2}\alpha + \frac{1}{2}\alpha^2 - \frac{1}{2}\alpha^3$$
$$P1 = (1-C2) + \frac{(3C2-1)}{2}\alpha - \alpha^2 + \frac{1}{2}\alpha^3$$
$$P0 = \frac{C2}{2} + \frac{(-3C2-2)}{6}\alpha + \frac{1}{2}\alpha^2 - \frac{1}{6}\alpha^3$$

Figure 5:
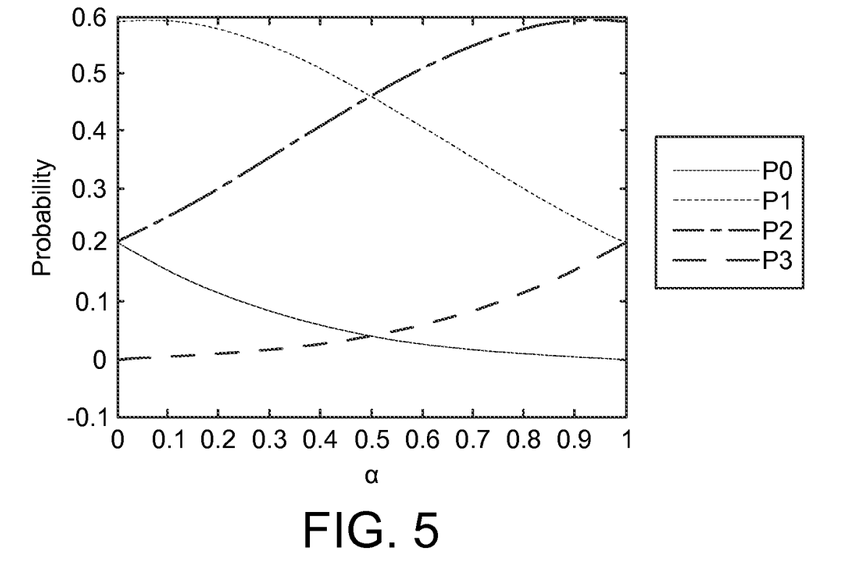
FIG. 5 shows a diagram illustrating the relationship between various probability mass functions and α values according to an embodiment of this disclosure.

FIG. 5 shows a diagram illustrating the relationship between various probability mass functions $f_i(S, \alpha)$ and $\alpha$ values according to an embodiment of this disclosure. In FIG. 5, {C1, C2, C3} equals {0, 0.41, 0}. When $\alpha$ changes, the probability mass function $f_i(S, \alpha)$ changes accordingly. However, no matter what $\alpha$ value is, P3+P2+P1+P0=1 and $E[\phi_{err}]$, $E[\phi_{err}^2]$, and $E[\phi_{err}^3]$ are all constant values. According to the result in FIG. 5, the next state generation unit 210 may select one of the probability mass functions $f_i(S, \alpha)$ as the characteristic probability distribution $f_c(S, \alpha)$ in response to the fractional part $\alpha$ of the phase error signal $\phi_{err}$.

The constant values {C1, C2, C3} may be arbitrarily set as long as a solution for {P0, P1, P2, P3} exists for the set of equations. Furthermore, by calculating the fourth and the fifth order expected values, the quality of the constant values thus set can further be evaluated. For example, according to the value setup in FIG. 5 where {C1, C2, C3} equals {0, 0.41, 0}, not only the first to third order expected values are constant values, but also the fourth and the fifth order expected values are nearly constant values. Therefore by setting {C1, C2, C3} to {0, 0.41, 0}, the modulator 20 can be insensitive to nonlinear effect up to the fifth order.

Figure 6:
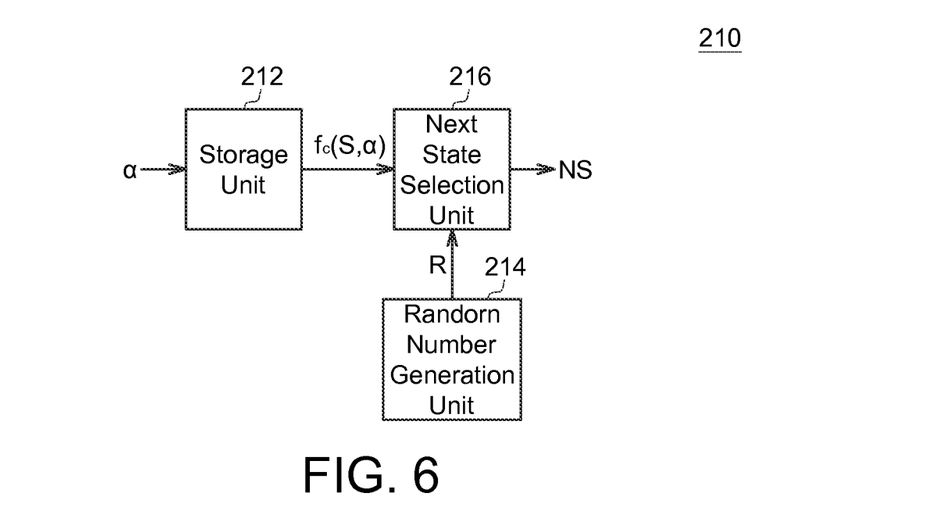
FIG. 6 shows a next state generation unit according to an embodiment of this disclosure.

FIG. 6 shows a next state generation unit according to an embodiment of this disclosure. The next state generation unit 210 includes a storage unit 212. The storage unit 212 stores a lookup table LUT, for storing the probability mass functions $f_i(S, \alpha)$ and converting the fractional part $\alpha$ of the phase error signal $\phi_{err}$ to the characteristic probability distribution $f_c(S, \alpha)$. An example of lookup table LUT is given in Table 1 below:

TABLE 1

| α | P0 | P1 | P2 | P3 |
|---|---|---|---|---|
| 0.1 | 0.156 | 0.592 | 0.248 | 0.004 |
| 0.3 | 0.084 | 0.548 | 0.352 | 0.146 |
| 0.5 | 0.040 | 0.460 | 0.460 | 0.040 |
| 0.7 | 0.016 | 0.352 | 0.548 | 0.084 |

For example, when $\alpha=0.3$, the characteristic probability distribution $f_c(S, 0.3)$ is {P0, P1, P2, P3}={0.084, 0.548, 0.352, 0.146}. Table 1 is just an example of the lookup table LUT stored in the storage unit 212. The step size of $\alpha$ value can be adjusted subject to precision requirement. The size of the lookup table LUT is adjusted accordingly. The constant values C0-C3 may also be different, resulting in different P0-P3 values. The storage unit 212 may be implemented by a read only memory, a non-volatile memory device, such as a flash memory, or a hard disk drive.

Refer to FIG. 6, the next state generation unit 210 includes a random number generation unit 214 and a next state selection unit 216. The random number generation unit 214 generates a random number R. For example, the random number R has a uniform probability distribution between interval [0, 1]. The next state selection unit 216 generates the next state signal NS in response to the random number R and the characteristic probability distribution $f_c(S, \alpha)$.

Figure 7:
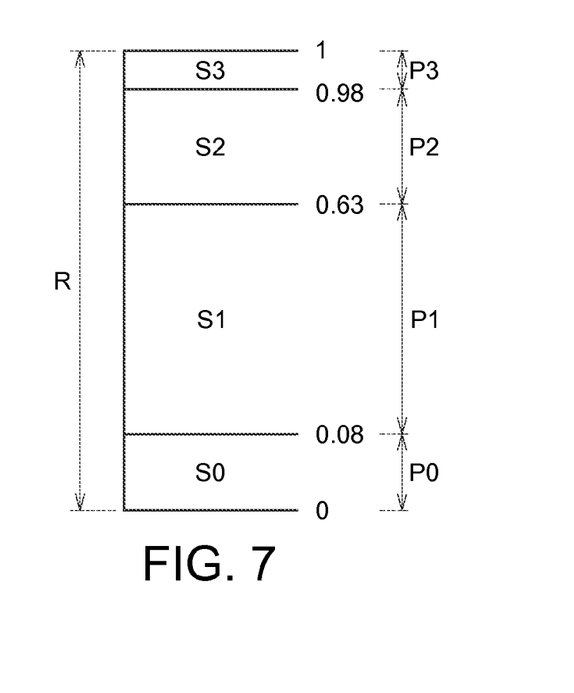
FIG. 7 shows a diagram illustrating the relationship between the random number and the characteristic probability distribution according to an embodiment of this disclosure.

FIG. 7 shows a diagram illustrating the relationship between the random number R and the characteristic probability distribution $f_c(S, \alpha)$ according to an embodiment of this disclosure. In this example, the probability mass function {P0, P1, P2, P3}={0.08, 0.55, 0.35, 0.02} is chosen as the characteristic probability distribution $f_c(S, \alpha)$. On the right of FIG. 7 shows the individual interval occupied by each state according to the characteristic probability distribution $f_c(S, \alpha)$. The random number R has an equal probability being any real number between interval [0, 1]. Depending on the value of the random number R, the next state selection unit 216 chooses the corresponding next state signal NS where the random number R falls in. The next state selection unit 216 may be implemented by digital circuit blocks including a multiplexer and a comparator.

The random number generation unit 214 may be implemented by analog circuit blocks and/or digital circuit blocks, such as a pseudo random number generator with seed generating function. In one embodiment, the random number generation unit 214 is capable of controlling the frequency properties of the random number sequence generated. Specifically, the random number R has a uniform distribution in time domain. However in frequency domain, the spectrum of the random number R is pushed toward the high frequency band. For example, the random number generation unit 214 may enlarge the variation between successive numbers generated to make the spectrum shift toward high frequency bands. Because the PLL 1 effectively filters out high frequency components, for example, by the loop filter 12, the high frequency component produced within the modulator 20 can be effectively filtered out. Therefore the modulator 20 proposed in this disclosure also achieves good noise shaping ability.

After the current state signal CS and the next state signal NS of the modulator 20 have been determined, the code generation unit 206 generates the control code $C_M$ in response to the current state signal CS and the next state signal NS. The current state signal CS and the next state signal NS are related to the phase error signal $\phi_{err}$, and the control code $C_M$ affects the frequency error signal $f_{err}$. Because frequency error may be obtained by calculating the difference between successive phase errors, in one embodiment the code generation unit 206 generates the control code $C_M$ by calculating a difference between the next state signal NS and the current state signal CS. For example, the next state signal NS equals the control code $C_M$ added to the current state signal CS.

There are four possible states for the phase error signal $\phi_{err}$ in the embodiment described above. However, the number of possible states is not limited thereto. In order to achieve the capability of being insensitive to a higher order nonlinear effect, the number of states may be further increased. For example, the number of states can be increased to six to take the fifth order nonlinear function into consideration. In this case, the probability mass function has six variables, and six equations can be listed including the first to fifth order expected values and the universal relationship (sum of probability values equals 1). The set of equations is therefore solvable to yield six variables in the probability mass function.

The modulator proposed in this disclosure controls the next state signal by probability. By determining the characteristic probability distribution according to the current phase error signal, the next state signal can be generated such that the modulator is insensitive to nonlinearity. Therefore fraction spurs can be eliminated to guarantee spectrum purity. In addition, the probability function can be stored in a lookup table and hence the next state calculation can be fast and consume low power. The modulator can be used in a fractional phase locked loop to control the multi modulus divider.

As low power design has become a major demand in modern technology, low supply voltage is much desired in circuit design. However, analog circuits operating under low supply voltage have poor linearity performance. As a consequence, the moderator proposed in this disclosure controls the circuit state in digital domain such that the control code generated by the moderator is insensitive to nonlinearity. Therefore the PLL adopting the moderator proposed herein can operate under low supply voltage, such as being lower than 1.2V. For example, the phase detector 11, the loop filter 12, the voltage controlled oscillator 13, and the multi modulus divider 14 shown in FIG. 1 can be powered by a 1V supply voltage.

Figure 8:
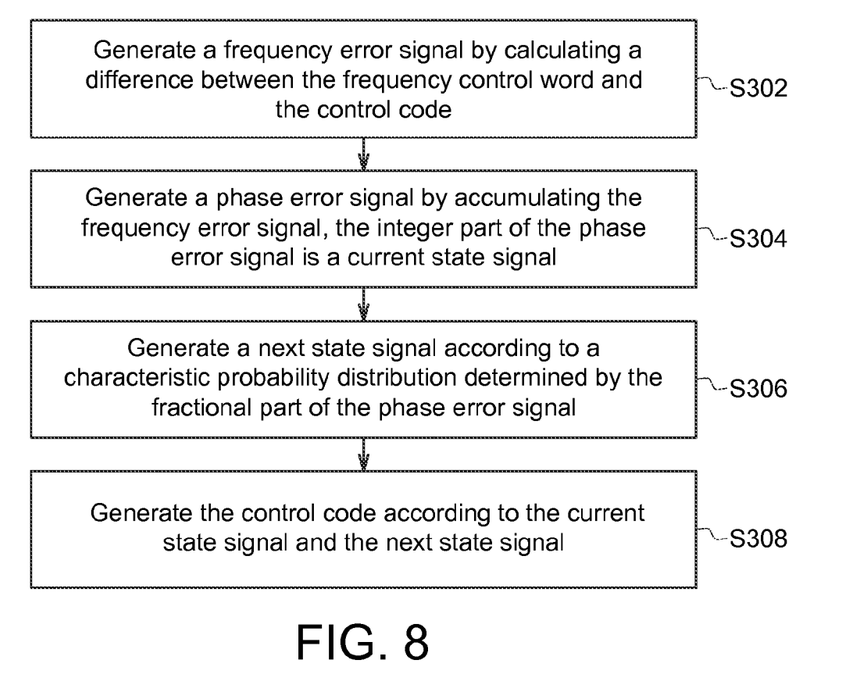
FIG. 8 shows a process of generating a control code in response to a frequency control word according to an embodiment of this disclosure.

FIG. 8 shows a process of generating a control code $C_M$ in response to a frequency control word FCW according to an embodiment of the invention. The process includes the following steps: step S302 generating a frequency error signal $f_{err}$ by calculating a difference between the frequency control word FCW and the control code $C_M$; step S304 generating a phase error signal $\phi_{err}$ by accumulating the frequency error signal $f_{err}$, wherein the phase error signal $\phi_{err}$ includes an integer part $\phi_1$ and a fractional part $\phi_2$, and the integer part $\phi_1$ of the phase error signal $\phi_{err}$ is a current state signal CS; step S306 generating a next state signal NS according to a characteristic probability distribution $f_c(s, \alpha)$ determined by the fractional part $\phi_2$ of the phase error signal $\phi_{err}$; step S308 generating the control code $C_M$ according to the current state signal and the next state signal. The detailed calculation has been described and thus is not repeated here.

A method for generating a probability mass function for a discrete random variable is also provided in this disclosure. The discrete random variable is an integer part of a phase error signal. The method may be implemented by a computer, such as being executed by a processor. The method includes the following step: determining, by the processor, the probability mass function as a function of a fractional part of the phase error signal, wherein a first expected value of the phase error signal according to the probability mass function is a first constant value C1 regardless of the fractional part of the phase error signal. In one embodiment, a second expected value of the phase error signal to the second power according to the probability mass function is a second constant value C2 regardless of the fractional part of the phase error signal. In one embodiment, a third expected value of the phase error signal to the third power according to the probability mass function is a third constant value C3 regardless of the fractional part of the phase error signal. The probability mass function is used to determine a next state signal in response to the phase error signal in a modulator used in a fractional phase locked loop.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A modulator, for generating a control code in response to a frequency control word, comprising:
   an adder, for generating a frequency error signal by calculating a difference between the frequency control word and the control code;
   an accumulator, for generating a phase error signal by accumulating the frequency error signal, wherein the phase error signal comprises an integer part and a fractional part, and the integer part of the phase error signal is a current state signal;
   a next state generation unit, for generating a next state signal in response to a characteristic probability distribution determined by the fractional part of the phase error signal; and
   a code generation unit, for generating the control code in response to the current state signal and the next state signal.

2. The modulator of claim 1, wherein the code generation unit generates the control code by calculating a difference between the next state signal and the current state signal.

3. The modulator of claim 1, wherein the next state signal is a discrete random variable with a plurality of probability mass functions corresponding to different values of the fractional part of the phase error signal, and the next state generation unit selects one of the probability mass functions as the characteristic probability distribution in response to the fractional part of the phase error signal.

4. The modulator of claim 3, wherein a plurality of first expected values of the phase error signal corresponding to the plurality of the probability mass functions are the same.

5. The modulator of claim 4, wherein a plurality of second expected values of the phase error signal to the second power corresponding to the plurality of the probability mass functions are the same.

6. The modulator of claim 5, wherein a plurality of third expected values of the phase error signal to the third power corresponding to the plurality of the probability mass functions are the same.

7. The modulator of claim 3, wherein the next state generation unit comprises:
 a storage unit, for storing a lookup table, wherein the lookup table stores the probability mass functions and converts the fractional part of the phase error signal to the characteristic probability distribution.

8. The modulator of claim 3, wherein the next state generation unit comprises:
 a random number generation unit, for generating a random number; and
 a next state selection unit, for generating the next state signal in response to the random number and the characteristic probability distribution.

9. A phase locked loop, for generating an output signal in response to a reference signal and a frequency control word, comprising:
 a phase detector, for generating a phase difference between the reference signal and a feedback signal;
 a loop filter, for generating a control voltage by removing a high frequency component of the phase difference;
 a voltage controlled oscillator, for generating the output signal oscillating at a frequency in response to the control voltage;
 a multi modulus divider, for generating the feedback signal by dividing the frequency of the output signal by a divisor controlled by a control code; and
 a modulator, for generating the control code in response to the frequency control word, comprising:
 an adder, for generating a frequency error signal by calculating a difference between the frequency control word and the control code;
 an accumulator, for generating a phase error signal by accumulating the frequency error signal, wherein the phase error signal comprises an integer part and a fractional part, and the integer part of the phase error signal is a current state signal; and
 a next state generation unit, for generating a next state signal in response to a characteristic probability distribution determined by the fractional part of the phase error signal; and
 a code generation unit, for generating the control code in response to the current state signal and the next state signal.

10. The phase locked loop of claim 9, wherein the code generation unit generates the control code by calculating a difference between the next state signal and the current state signal.

11. The phase locked loop of claim 9, wherein the next state signal is a discrete random variable with a plurality of probability mass functions corresponding to different values of the fractional part of the phase error signal, and the next state generation unit selects one of the probability mass functions as the characteristic probability distribution in response to the fractional part of the phase error signal.

12. The phase locked loop of claim 11, wherein a plurality of first expected values of the phase error signal corresponding to the plurality of the probability mass functions are the same.

13. The phase locked loop of claim 12, wherein a plurality of second expected values of the phase error signal to the second power corresponding to the plurality of the probability mass functions are the same.

14. The phase locked loop of claim 13, wherein a plurality of third expected values of the phase error signal to the third power corresponding to the plurality of the probability mass functions are the same.

15. The phase locked loop of claim 11, wherein the next state generation unit comprises:
 a storage unit, for storing a lookup table, wherein the lookup table stores the probability mass functions and converts the fractional part of the phase error signal to the characteristic probability distribution.

16. The phase locked loop of claim 11, wherein the next state generation unit comprises:
 a random number generation unit, for generating a random number; and
 a next state selection unit, for generating the next state signal in response to the random number and the characteristic probability distribution.

17. The phase locked loop of claim 9, wherein a supply voltage of the phase locked loop is below 1.2V.

18. A method for generating a control code in response to a frequency control word, the control code controlling a multi modulus divider in a fractional phase locked loop, the method comprising:
 generating a frequency error signal by calculating a difference between the frequency control word and the control code;
 generating a phase error signal by accumulating the frequency error signal, wherein the phase error signal comprises an integer part and a fractional part, and the integer part of the phase error signal is a current state signal;
 generating a next state signal according to a characteristic probability distribution determined by the fractional part of the phase error signal; and
 generating the control code according to the current state signal and the next state signal.

19. The method of claim 18, wherein the control code is generated according to a difference between the next state signal and the current state signal.

20. The method of claim 18, wherein the next state signal is a discrete random variable with a plurality of probability mass functions corresponding to different values of the fractional part of the phase error signal, and one of the probability mass functions is selected as the characteristic probability distribution according to the fractional part of the phase error signal.

21. The method of claim 20, wherein a plurality of first expected values of the phase error signal corresponding to the plurality of the probability mass functions are the same.

22. The method of claim 21, wherein a plurality of second expected values of the phase error signal to the second power corresponding to the plurality of the probability mass functions are the same.

23. The method of claim 22, wherein a plurality of third expected values of the phase error signal to the third power corresponding to the plurality of the probability mass functions are the same.

24. The method of claim 20, wherein the probability mass functions are stored in a lookup table, and the lookup table converts the fractional part of the phase error signal to the characteristic probability distribution.

25. The method of claim 20, wherein the next state signal is generated according to a random number and the characteristic probability distribution.

* * * * *